United States Patent
Liikanen

(10) Patent No.: US 10,971,233 B2
(45) Date of Patent: *Apr. 6, 2021

(54) READ WINDOW BUDGET BASED DYNAMIC PROGRAM STEP CHARACTERISTIC ADJUSTMENT

(71) Applicant: Micron Technology, Inc., Boise, ID (US)

(72) Inventor: Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/875,277

(22) Filed: May 15, 2020

(65) Prior Publication Data

US 2020/0279609 A1  Sep. 3, 2020

Related U.S. Application Data

(63) Continuation of application No. 16/214,326, filed on Dec. 10, 2018, now Pat. No. 10,706,935.

(51) Int. Cl.
| | |
|---|---|
| *G11C 16/10* | (2006.01) |
| *G06F 3/06* | (2006.01) |
| *G11C 16/34* | (2006.01) |
| *G11C 16/04* | (2006.01) |

(52) U.S. Cl.
CPC ............ *G11C 16/10* (2013.01); *G06F 3/0604* (2013.01); *G06F 3/0659* (2013.01); *G06F 3/0679* (2013.01); *G11C 16/0483* (2013.01); *G11C 16/349* (2013.01)

(58) Field of Classification Search
CPC .... G06F 3/0604; G06F 3/0679; G06F 3/0659; G11C 16/0483; G11C 16/10; G11C 16/349

See application file for complete search history.

(56) References Cited

U.S. PATENT DOCUMENTS

| 8,862,969 B2 | 10/2014 | Liikanen et al. | |
|---|---|---|---|
| 2007/0247916 A1* | 10/2007 | Chen | G11C 16/3459 365/185.18 |
| 2014/0059406 A1* | 2/2014 | Hyun | G11C 11/5621 714/773 |
| 2015/0092488 A1* | 4/2015 | Wakchaure | G11C 16/26 365/185.03 |
| 2016/0180951 A1* | 6/2016 | Darragh | G06F 11/008 365/185.11 |
| 2016/0357458 A1* | 12/2016 | Pangal | G06F 3/0653 |

(Continued)

OTHER PUBLICATIONS

U.S. Appl. No. 15/981,835, entitled "Memory System Quality Margin Analysis and Configuration", filed May 16, 2018, Client Reference No. 2018-0169.00/US, (40 pgs.).

(Continued)

*Primary Examiner* — Eric T Oberly
(74) *Attorney, Agent, or Firm* — Brooks, Cameron & Huebsch, PLLC

(57) ABSTRACT

A read window budget (RWB) corresponding a group of memory cells is determined. The determined RWB and a target RWB is compared. In response to the determined RWB being different than the target RWB, one or more program step characteristics are adjusted to adjust the determined RWB toward the target RWB.

20 Claims, 11 Drawing Sheets

(56) References Cited

U.S. PATENT DOCUMENTS

2017/0162268 A1* 6/2017 Chen .................. G11C 11/5642
2017/0256320 A1* 9/2017 Lang .................. G11C 16/3445
2018/0341552 A1   11/2018 Liikanen et al.

OTHER PUBLICATIONS

U.S. Appl. No. 16/182,399, entitled "Memory Element Profiling and Operational Adjustments", filed Nov. 6, 2018, Client Reference No. 2018-0057.00/US, (34 pgs.).
U.S. Appl. No. 16/121,565, entitled "Memory Characterization and Sub-System Modification", filed Sep. 4, 2018, Client Reference No. 2017-1179.00/US, (41 pgs.).

* cited by examiner

US 10,971,233 B2

READ WINDOW BUDGET BASED DYNAMIC PROGRAM STEP CHARACTERISTIC ADJUSTMENT

PRIORITY INFORMATION

This application is a Continuation of U.S. application Ser. No. 16/214,326, filed Dec. 10, 2018, the contents of which are incorporated herein by reference.

TECHNICAL FIELD

Embodiments of the disclosure relate generally to memory sub-systems, and more specifically, relate to read window budget based dynamic program step characteristic adjustment.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
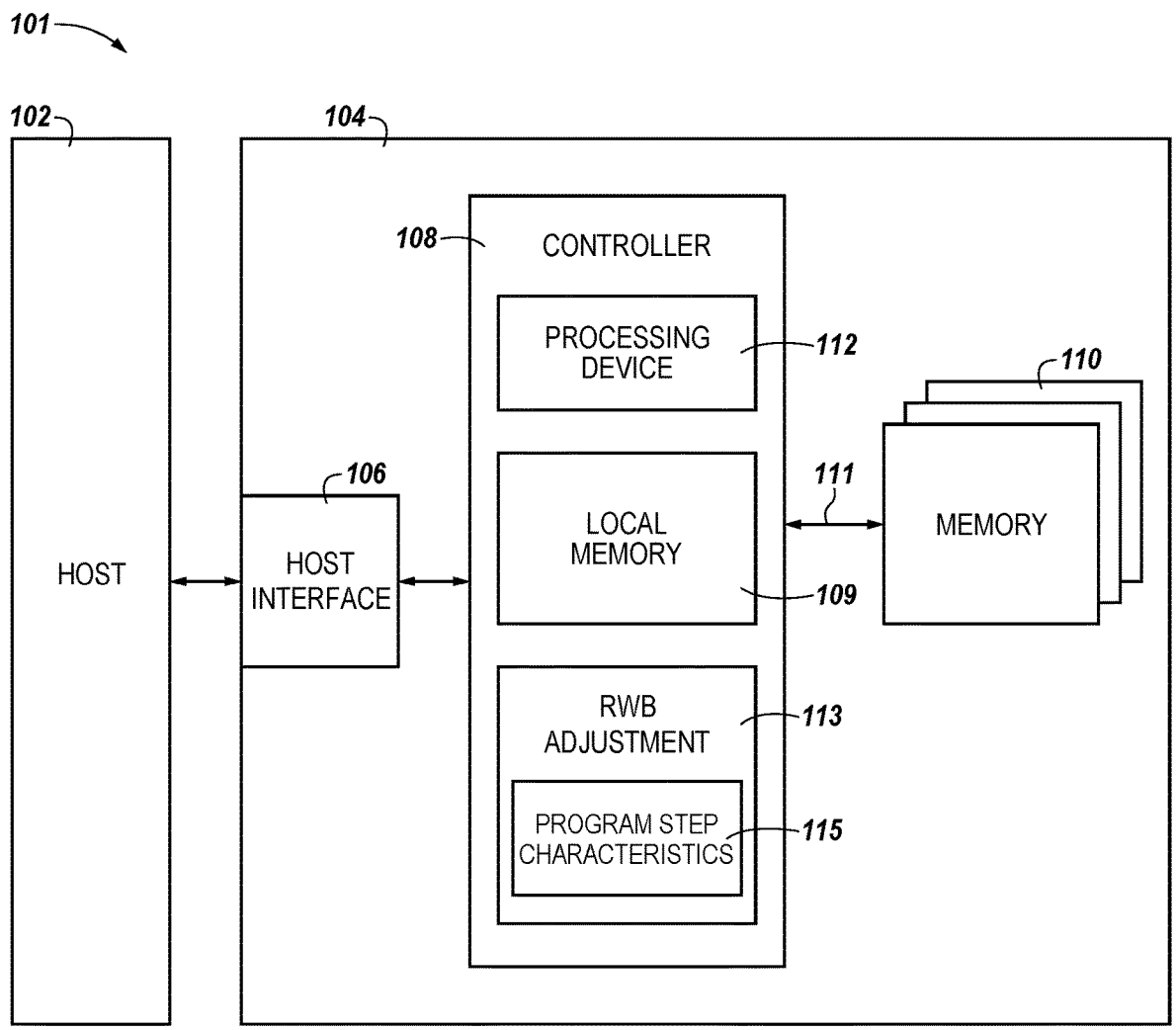
FIG. 1 illustrates an example computing environment that includes a memory sub-system in accordance with some embodiments of the present disclosure.

Aspects of the present disclosure are directed to managing read window budget within a memory sub-system. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

In various memory sub-systems, programming cells can involve providing a programming signal to a group of cells (e.g., a page) to place them in target states, which correspond to respective stored data patterns. For example, the cells can be non-volatile flash memory cells configured to store one or more bits of data per cell. As an example, a programming signal used to program the cells can comprise a stepped voltage signal (e.g., voltage ramp) with each step having an associated step size and duration. The programming signal can be applied (e.g., to a word line) as a series of voltage pulses, for instance. The voltage pulses have various characteristics which can affect a read window budget (RWB) associated with the programmed cells. An RWB can refer to the cumulative value (e.g., in voltage) of a number (e.g., seven) of distances (e.g., in voltage) between adjacent threshold voltage distributions at a particular BER. Such characteristics include pulse magnitude, step size between pulses (e.g., program step size), and pulse duration (e.g., program step duration), among various other characteristics. As used herein, a program step size can be referred to as a voltage difference between successive voltage pulses, and a program step duration can be referred to as a duration for which a voltage pulse is applied. In relation to program step duration, in at least one example, program step duration can be measured by counting clock cycles of a known frequency between a time a program command was issued to a memory (e.g., NAND) and when the memory programming operation is complete. In another example, the program step duration can be measured by using a number of program pulses used to complete the memory program operation and apply a known amount of time for each pulse.

As described further herein, a read window, which may be referred to as a read window width, refers to a distance (e.g., in voltage) between adjacent threshold voltage (Vt) distributions at a particular bit error rate (BER). A read window may also be referred to as a "valley margin" since the Vt distributions include respective peaks with the regions therebetween being referred to as valleys. The RWB can refer to a cumulative value of read windows for a group of programmed cells (e.g., one or more pages of cells). For example, cells configured to store three bits of data per cell may be programmed to one of eight different Vt distributions, each corresponding to a respective data state. In this example, the RWB can be the cumulative value (e.g., in voltage) of the seven read windows between the eight Vt distributions. The RWB corresponding to a group of memory cells is affected by various factors such as temperature, wear cycling (e.g., program/erase cycles), etc. Therefore, the RWB(s) of a system can vary over time, which can affect system quality of service (QoS), reliability, and/or performance. In various instances, it can be beneficial to maintain a specified RWB in order to maintain a particular system characteristic (e.g., QoS, error rate, etc.) across various environmental conditions and/or user workloads. However, it can also be beneficial to provide the ability to dynamically adjust a RWB (e.g., to a target value) in order to change one or more system characteristics. For instance, it may be beneficial to provide one system, or components thereof, with a relatively high RWB associated with high reliability (e.g., low bit error rate) and another system, or components thereof, with a relatively low RWB associated with higher speed. It can also be beneficial to adjust the RWB of a particular system or component thereof such that the system operates at different reliability levels and speed at different times.

Conventional memory sub-systems do not dynamically adjust RWB and/or are not capable of adjusting the RWB in a predictable and/or controllable manner. Therefore, various conventional systems are not able to, for example, maintain a target RWB with changing temperature and/or program/erase cycling.

In contrast, embodiments of the present disclosure address the above and other deficiencies by providing a memory sub-system capable of finely controlling (e.g., tuning) a RWB in a more efficient manner as compared to previous approaches. For example, embodiments are capable of to achieving and maintaining a target RWB by modifying one or more characteristics of voltage signals (e.g., pulses) used to program memory cells. Such a memory sub-system can provide various benefits such as those described above. For instance, embodiments can control a RWB to maintain a particular level of quality, reliability, and/or performance of the system in various environmental conditions and/or user workloads.

FIG. 1 illustrates an example computing environment 101 that includes a memory sub-system 104 in accordance with some embodiments of the present disclosure. The memory sub-system 104 can include media, such as memory components 110. The memory components 110 can be volatile memory components, non-volatile memory components, or a combination of such. In some embodiments, the memory sub-system is a storage system. An example of a storage system is a SSD. In some embodiments, the memory sub-system 104 is a hybrid memory/storage sub-system. In general, the computing environment 100 can include a host system 102 that uses the memory sub-system 104. For example, the host system 102 can write data to the memory sub-system 104 and read data from the memory sub-system 104.

The host system 102 can be a computing device such as a personal laptop computer, a desktop computer, a digital camera, a mobile telephone, or a memory card reader, among various other types of hosts. The host system 102 can include or be coupled to the memory sub-system 104 (e.g., via a host interface 106) so that the host system 120 can read data from or write data to the memory subsystem 104. As used herein, "coupled to" generally refers to a connection between components, which can be an indirect communicative connection or direct communicative connection (e.g., without intervening components), whether wired or wireless, including connections such as electrical, optical, magnetic, etc. The host interface 106 can be a physical interface, examples of which include, but are not limited to, a serial advanced technology attachment (SATA) interface, a peripheral component interconnect express (PCIe) interface, universal serial bus (USB) interface, Fibre Channel, Serial Attached SCSI (SAS), etc. The host interface 106 can be used to transmit data between the host system 120 and the memory sub-system 104. The host system 102 can further utilize an NVM Express (NVMe) interface to access the memory components 110 when the memory sub-system 104 is coupled with the host system 102 by a PCIe interface. The physical host interface can provide an interface for passing control, address, data, and other signals between the memory sub-system 104 and the host system 102. The memory components 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device can be configured to store 8 KB (kilobytes) of user data per page, 128 pages of user data per block, 2048 blocks per plane, and 16 planes per device. The memory components 110 can also include additionally circuitry (not illustrated), such as control circuitry, buffers, address circuitry, etc.

In operation, data can be written to and/or read from memory (e.g., memory components 110 of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

The memory components 110 can include various combinations of the different types of non-volatile memory components and/or volatile memory components. An example of non-volatile memory components includes a negative-and (NAND) type flash memory. The memory components 110 can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 102. Although non-volatile memory components such as NAND type flash memory are described, the memory components 110 can be based on various other types of memory such as a volatile memory. In some embodiments, the memory components 110 can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 110 can be grouped as memory pages or data blocks that can refer to a unit of the memory component used to store data.

As illustrated in FIG. 1, the memory sub-system 104 can include a controller 108 coupled to the host interface 106 and to the memory components 110 via a memory interface 111. The controller 108 can be used to send data between the memory sub-system 104 and the host 102. The memory interface 111 can be one of various interface types compliant with a particular standard such as Open NAND Flash interface (ONFi).

The controller 108 can communicate with the memory components 110 to perform operations such as reading data, writing data, or erasing data at the memory components 110 and other such operations. The controller 108 can include hardware such as one or more integrated circuits and/or discrete components, a buffer memory, or a combination thereof. The controller 108 can be a microcontroller, special purpose logic circuitry (e.g., a field programmable gate array (FPGA), an application specific integrated circuit (ASIC), etc.), or other suitable processor. The controller 108 can include a processing device 112 (e.g., processor) configured to execute instructions stored in local memory 109. In the illustrated example, the local memory 109 of the controller 108 includes an embedded memory configured to store instructions for performing various processes, operations, logic flows, and routines that control operation of the memory sub-system 104, including handling communications between the memory sub-system 104 and the host system 102. In some embodiments, the local memory 109 can include memory registers storing memory pointers, fetched data, etc. The local memory 109 can also include read-only memory (ROM) for storing micro-code.

While the example memory sub-system 104 in FIG. 1 has been illustrated as including the controller 108, in another embodiment of the present disclosure, a memory sub-system 104 may not include a controller 108, and can instead rely upon external control (e.g., provided by an external host, such as by a processing device separate from the memory sub-system 104).

The controller 108 can use and/or store various operating parameters associated with operating (e.g., programming and/or reading) the memory cells. Such operating parameters may be referred to as trim values and can include programming pulse magnitude, step size, pulse duration, program verify voltages, read voltages, etc. for various different operating processes. The different processes can include processes to program cells to store different quantities of bits, and different multiple pass programming process types (e.g., 2-pass, 3-pass, etc.). The controller 108 can be responsible for other operations such as wear leveling operations, garbage collection operations, error detection and/or correction (e.g., error-correcting code (ECC)) operations, encryption operations, caching operations, and address translations between a logical block address and a physical block address that are associated with the memory components 110.

The memory sub-system 104 can also include additional circuitry or components that are not illustrated. For instance, the memory components 110 can include control circuitry, address circuitry (e.g., row and column decode circuitry), and/or input/output (I/O) circuitry by which they can communicate with controller 108 and/or host 102. As an example, in some embodiments, the address circuitry can receive an address from the controller 108 and decode the address to access the memory components 110.

Figure 2:
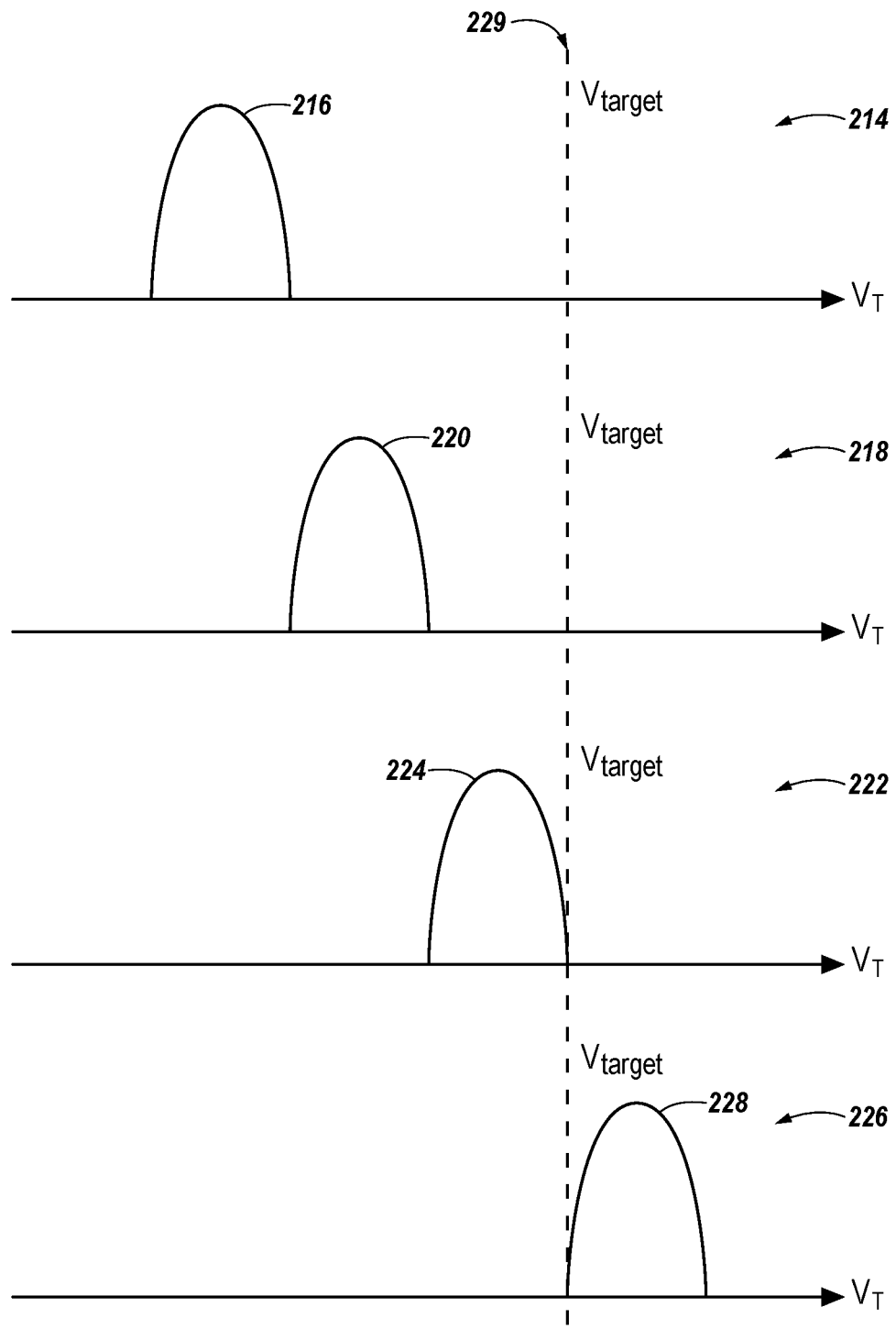
FIG. 2 illustrates an example of programming memory cells in accordance with some embodiments of the present disclosure.

In various embodiments, the controller 108 can include a RWB adjustment component 113 that controls and/or communicates with a program step characteristic component 115 to determine and/or control one or more program step characteristics used to program cells. The program step characteristics can include, for example, various characteristics of voltage pulses used to program memory cells of the memory components 110. The characteristic can be, for example, a step size (e.g., voltage difference) between programming voltage pulses (e.g., between consecutive pulses). In another example, the characteristic can be a duration for which programming voltage pulse(s) are applied to memory cells. The memory cells can be programmed, for example, via an incremental step pulse programming (ISPP) process in which a series of pulses of increasing magnitude are applied to the cells (to their gates) to increase the stored charge by a particular amount until the target stored threshold voltage (Vt) is reached. For instance, FIG. 2 illustrates threshold voltage (Vt) distributions of cells, which correspond to the charge stored on the charge storage structures of the memory cells, at various stages of one such incremental programming operation. Stage 214 can represent a time at which the programming operation begins. Accordingly, as shown by Vt distribution 216, the Vt of all the cells is below the target Vt level (Vtarget) 229. To program the memory cells to the desired target Vtarget 229, a series of programming steps (e.g., voltage pulses) can be used at each of a number of subsequent stages 218, 222 and 226 to increase the cell Vt levels as shown by distributions 220, 224 and 228, respectively. After each programming step, a program verify operation can be performed to verify whether the cells being programmed have reached Vtarget 229. As shown in FIG. 2, programming of the cells is completed at stage 226, as the Vt levels of all the cells have been increased to at or above the desired target Vt level 229.

The amount by which the Vt distributions 216, 220, 224, and 228 increase responsive to an applied programming pulse can depend on various factors such as the magnitude of the pulse and the duration for which the pulse is applied to the cells. Accordingly, the time to program a group of cells to desired states can vary depending upon the programming signal characteristics as well as the quantity of pulses. Additionally, as described further below, multiple programming passes can be used to program multiple logical page data to cells. For example, a first pass, which can be referred to as a lower page programming process, can be used to program one or more lower pages of data to a group of cells, and one or more subsequent programming passes can be used to program additional pages of data to the group of cells.

Figure 3:
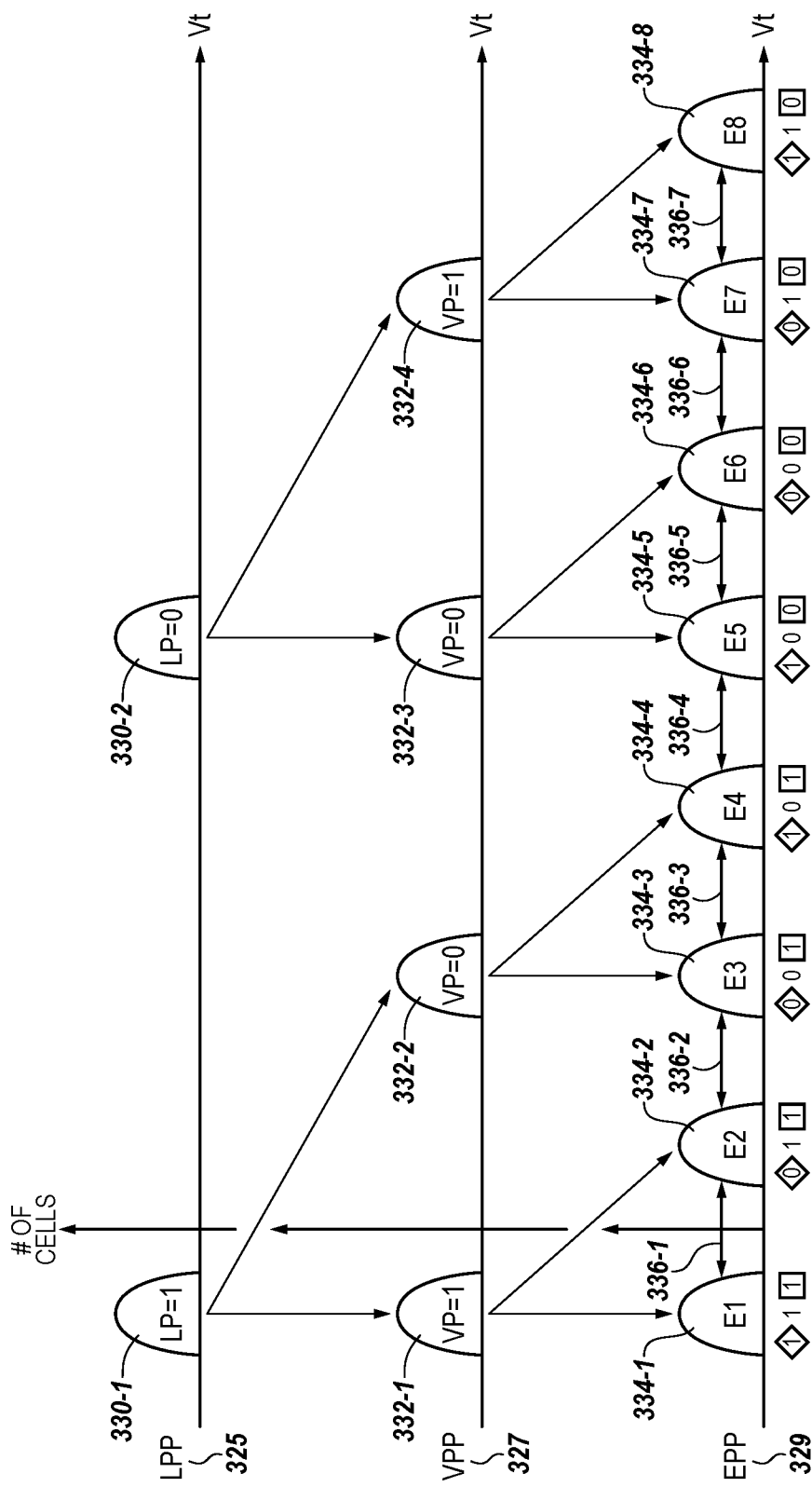
FIG. 3 illustrates threshold voltage distributions associated with a programming process in accordance with some embodiments of the present disclosure.

The diagram shown in FIG. 3 illustrates threshold voltage (Vt) distributions associated with a programming process in accordance with embodiments of the present disclosure. In this example, the process is a two-pass programming process in which a lower page (e.g., lease significant bit) of a group of memory cells is programmed in a first programming pass and an upper page (e.g., middle bit) and extra page (e.g., most significant bit) of the group are programmed in a second programming pass. The first programming pass can be referred to as a lower page programming (LPP) process 325, and the second programming pass can be referred to as an upper page programming and extra page programming process (UPP/EPP) 329.

As described further below, each of the LPP process 325 and UPP/EPP process 329 can involve application of a series of programming pulses to a selected word line corresponding to the group of cells being programmed. As part of the LPP process 325, the Vt of the memory cells are adjusted (e.g., from an erased Vt level) to one of two levels represented by Vt distributions 330-1 and 330-2. The voltage levels are represented by Vt distributions, which can reflect a statistical average Vt level of cells programmed to a particular level. In this example, cells whose lower page is to store a bit value of "1" (e.g., LP=1) are programmed to distribution 330-1 during LPP process 325, and cells whose lower page is to store a bit value of "0" (e.g., LP=0) are programmed to distribution 330-2 during LPP process 325. A lower page is a lower order page and is programmed in the array of memory cells before higher order pages are programmed.

As part of the UPP/EPP process 329, the Vt of the memory cells are adjusted to one of eight levels represented by Vt distributions 334-1 to 334-8, which correspond to data states E1 to E8, respectively, with each one of the data states E1 to E8 representing a different 3-bit stored data pattern. In this example, cells programmed to data state E1 store data "111," cells programmed to data state E2 store data "011," cells programmed to data state E3 store data "001," cells programmed to data state E4 store data "101," cells programmed to data state E5 store data "100," cells programmed to data state E6 store data "000," cells programmed to data state E7 store data "010," and cells programmed to data state E8 store data "110." While the example illustration includes a 2-pass programming, this is but one example. Additional quantities of program passes can be used.

FIG. 3 also illustrates the read windows (e.g., 336-1, 336-2, 336-3, 336-4, 336-5, 336-6, and 336-7) referred to collectively as read windows 336, corresponding to the data states E1 through E8 (e.g., respective Vt distributions 334-1 through 334-8). The read window budget for cells programmed to one of states E1 to E8 can refer to the sum of the read windows 336. As described below in association with FIG. 4, respective read windows can be measured at a particular (e.g., target) BER (e.g., BER 443 shown in FIG. 4).

Particular read windows 336 and/or a RWB can be determined for a group of memory cells. The group of cells can be, for example one or more pages of cells of the memory components 110. The group of cells can also be one or more blocks of memory cells, such as blocks of cells erased together in a particular erase operation. The one or more pages and/or the one or more blocks can be from a particular memory component (e.g., die) or from multiple dies. The group of memory cells for which a RWB is determined can be randomly selected or can be all of the pages of a memory component (e.g., 110) or system (e.g., 104), for instance; however, embodiments are not so limited. As described further herein, in a number of embodiments, a determined RWB can be adjusted (e.g., increased or decreased) by adjusting one or more programming pulse characteristics to achieve a target RWB for the group of memory cells. For example, the determined RWB can be compared to the target RWB, and at least one of a program step size and a program step duration can be adjusted in order to move the measured RWB toward the target RWB. Further details of measuring and adjusting the RWB is described below in connection with FIG. 4-10.

Figure 4:
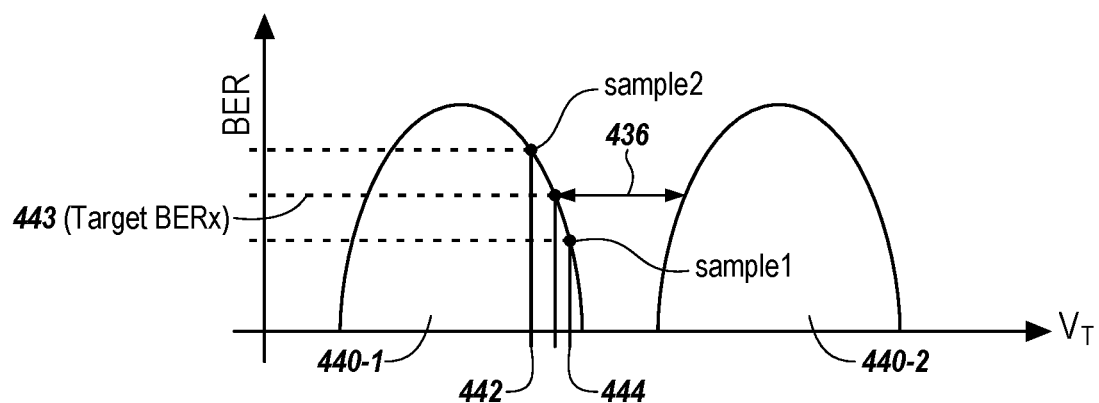
FIG. 4 illustrates a read window between threshold voltage distributions corresponding to memory cells programmed in accordance with some embodiments of the present disclosure.

FIG. 4 illustrates a read window 436 between threshold voltage (Vt) distributions 440-1 and 440-2 of memory cells programmed in accordance with some embodiments of the present disclosure. The example Vt distributions 440-1 and 440-2 (collectively referred to as Vt distributions 440) can be analogous to the Vt distributions shown in FIG. 3 (e.g., Vt distributions 334-1 334-8) and can correspond to a particular page of memory cells.

As illustrated in FIG. 4, the read window 436 can be a distance between adjacent edges of the Vt distributions 440-1 440-2. The read window between Vt distributions can be calculated, for example, by determining a location of the Vt distribution edges (e.g., on x-axis) by performing multiple read operations on a page of programmed cells using different read voltages and monitoring the bit error rate to determine the read voltage at which a minimum BER occurs for the page. In a number of embodiments, and as described in FIG. 4, a read window (e.g., 446) between adjacent Vt distributions (e.g., 440-1 and 440-2) can be determined based on a particular (e.g., target) BER for a page of cells. The target BER for purposes of read window determination can be user selected and can be 1E-3 or 1E-4, for instance. As an example, determining the read window 446 can include reading the page of cells using a first read voltage 444 (shown as "sample 1"). The first read voltage 444 can be a trim value used to distinguish between cells programmed to state 440-1 and state 440-2. In this example, the read using read voltage 444 results in a BER below the target BER. A subsequent read of the page of cells using a different (e.g., lower) read voltage 442 (shown as "sample 2") is performed. In this example, the read at 442 results in a BER above the target BER. Since the read at read voltage 442 corresponds to a BER above the target BER and the read at read voltage 444 corresponds to a BER below the target BER, the x-axis location (e.g., voltage) corresponding to the target BER 443 can be determined by interpolating between sample 1 and sample 2.

For the above example, the interpolation between sample 1 and sample 2 to determine the relative x-axis location corresponding to the target BER (e.g., "TargetBERx") can be demonstrated by the formula:

TargetBERx=Sample1+[(TargetBER−Sample1BER)/(Sample2BER−TargetBER)]

where "Sample1" is the read voltage 444 used for sample 1, "Sample1BER" is the BER determined for the read using read voltage 444 and "Sample2BER" is the BER determined for the read using read voltage 442.

A similar method can be employed to determine the x-axis location corresponding to the target BER for Vt distribution 440-2. Therefore, the read window 436 can be determined based on the difference between adjacent edges of Vt distributions 440-1 and 440-2 at the target BER 443. As described herein, the read window such as read window 436 can be summed with other read windows corresponding to a group (e.g., page) of cells to constitute an overall RWB. In various embodiments of the present disclosure, a determined (e.g., measured) RWB budget can be compared to a target RWB, and programming signal characteristics such as step size and/or step duration can be adjusted in order to achieve the target RWB. As an example, the step size and/or step duration can be adjusted (e.g., increased or decreased) each by a respective particular amount in response to determining that the determined RWB satisfies a threshold (is above or below the threshold value) associated with the target RWB.

Figure 5A:
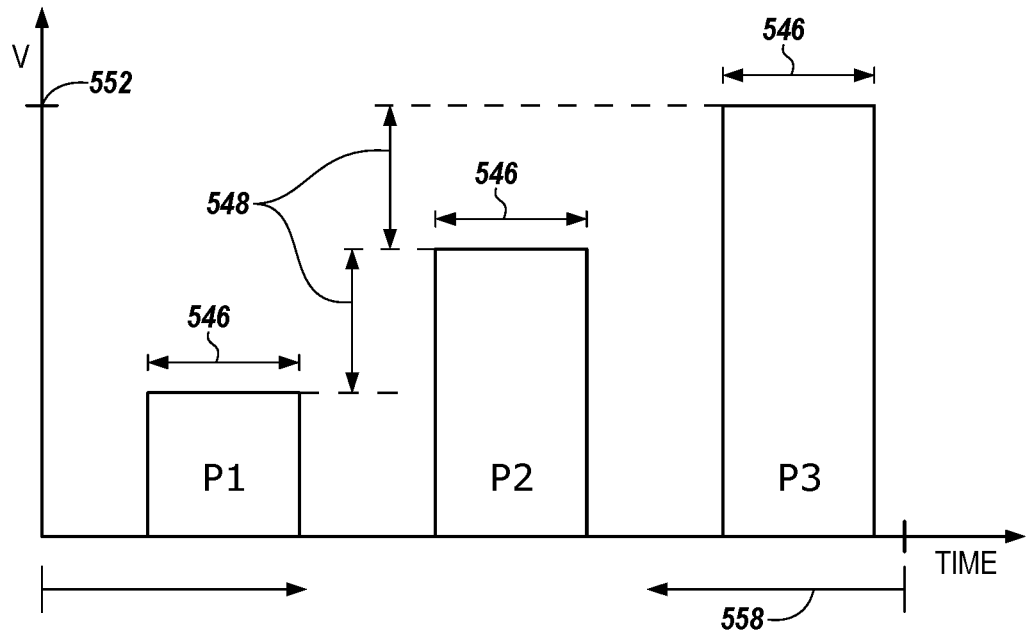
FIG. 5A-5B illustrate example programming steps whose characteristics can be adjusted in association with adjusting a read window budget in accordance with some embodiments of the present disclosure.
Figure 5B:
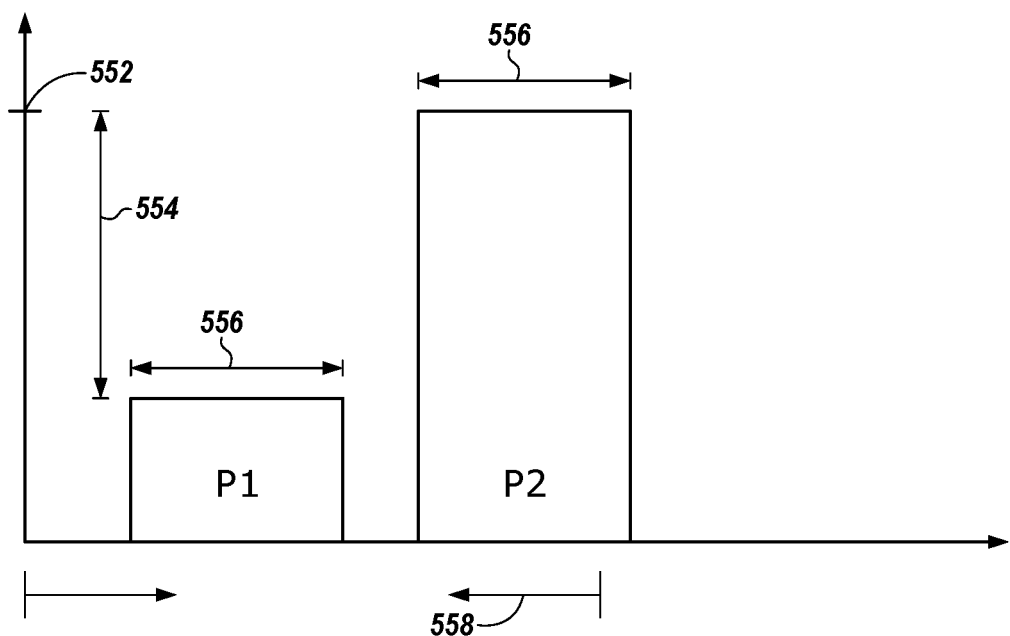

FIG. 5A-B each illustrate example programming signals in accordance with embodiments of the present disclosure. The example illustrations represent programming pulses applied to memory cells (e.g., to their gates) to increase the cell threshold voltages (Vts) to target levels. FIG. 5A illustrates a number of pulses P1, P2, and P3 associated with a programming operation having a particular program effective time (PET) 550. As shown in FIG. 5A, each pulse has a pulse duration 546, which may be referred to as a program step duration, and a program step size 548 between consecutive pulses.

The PET 550 can be associated with a series of pulses (e.g., P1, P2, P3) applied to a group of cells to place the cells of the group in respective target states. For example, the PET 550 can correspond for the amount of time to program each of a group of cells to one of the states E1 to E8 shown in FIG. 3. Memory systems in accordance with embodiments described herein can dynamically adjust (e.g., increase or decrease) the programming step size 548 and/or step duration 546 in order to achieve a desired RWB adjustment (e.g., to maintain a desired RWB). In at least one example, this dynamic increase or decrease can be performed by the program step characteristic component 115 to dynamically adjust or calibrate the programming step size 548 and/or duration 546.

FIG. 5B illustrates the programming operation shown in FIG. 5A after implementing a programming step adjustment. For comparison, the previous program step size and program step durations, such as 548 and 546, respectively, in FIG. 5A, are illustrated. The adjusted program step size 554 is a calibrated or changed instance of the program step size 548 for replacing the program step size 548. The adjusted program step size 554 is illustrated as being greater than the program step size 548, however, adjustments can be an increase or a decrease in the program step size. Likewise, the adjusted program step duration 556 is a calibrated or changed instance of the program step duration 546 for replacing the program step duration 546. The adjusted program step duration 556 is illustrated as being greater than the program step duration 546, however, adjustments can be an increase or a decrease in the program step duration depending on a desired change in the RWB. In the example shown in FIGS. 5A and 5B, the adjustments to the program step size 554 and the program step duration 556 result in a reduction in the PET 550; however, embodiments are not so limited.

As described further below, a relationship exists between the adjustment of a program step size and the adjustment of the program step duration. For instance, the adjustment of the program step size can be in a particular proportion to the adjustment of the program step duration based on a relationship between the program step size and the program step duration. As a result, a RWB can be adjusted by a particular amount by adjusting the program step size and/or duration by particular amounts based on the determined proportional relationship between step size and step duration and there respective effects on RWB.

In various embodiments, the RWB can be used as a feedback measure within the system, with the adjustment of one or more program step characteristics being used to adjust the RWB toward a target RWB responsive to a determination that the measured RWB is above or below the target RWB. As an example, as a RWB goes above a threshold RWB, a program step size and/or a program step duration can be adjusted to decrease the RWB corresponding to a group of cells. Vice versa, as a RWB goes below a threshold RWB, a program step size and/or a program step duration can be adjusted to increase the RWB. Dynamically adjusting or calibrating the programming step size 548 and/or duration 546 to affect the RWB is described further in association with FIGS. 6-8 below.

Figure 6:
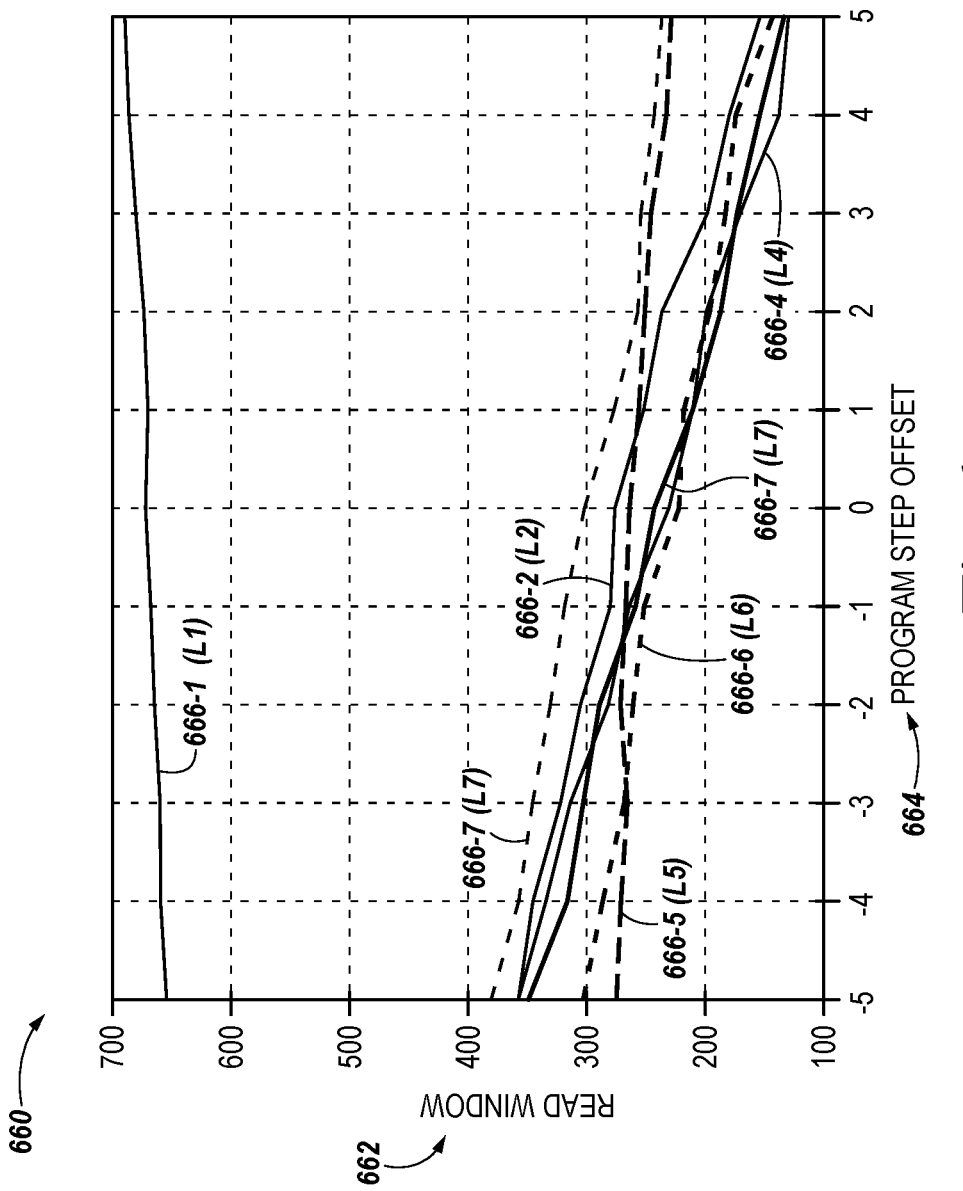
FIG. 6 is a graph illustrating how adjusting one or more program step characteristics affects the read window budget in accordance with some embodiments of the present disclosure.

FIG. 6 is a graph 600 illustrating how adjusting one or more program step characteristics affects the read window budget in accordance with some embodiments of the present disclosure. The graph 600 illustrates a linear relationship between read windows 666-1 to 666-7 and program step size corresponding a group of cells each programmed to one of eight Vt distributions (e.g., respective read windows 336 shown in FIG. 3). The x-axis of graph 660 represents a program step size offset. As an example, an offset of "0" can correspond to a default program step size, with each increment or decrement to the offset representing a respective increase or decrease to the program step size (e.g., 10 mV, 100 mV, 1V, etc.). As shown in graph 660, the read windows 666-2 to 666-7 generally decrease linearly with increased program step size. Accordingly, the RWB can be adjusted by a known amount by adjusting (incrementing/decrementing) the program step size by a particular offset amount, which can allow the RWB to be used as a feedback metric in order to maintain a target RWB, for example.

Figure 7:
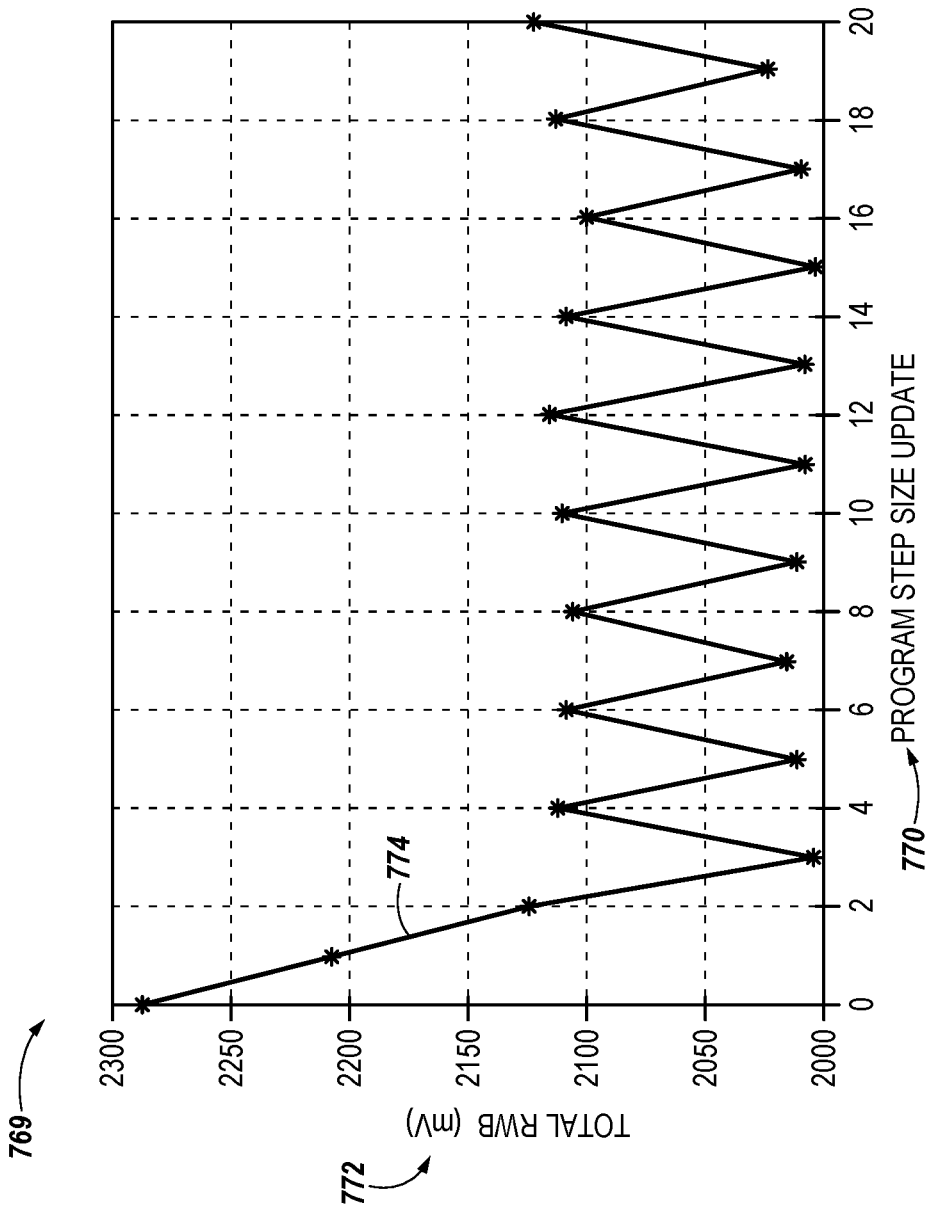
FIG. 7 is a diagram illustrating how adjusting one or more program step characteristics affects the read window budget in accordance with some embodiments of the present disclosure.

FIG. 7 is a diagram 769 illustrating how adjusting one or more program step characteristics affects the read window budget in accordance with some embodiments of the present disclosure. Curve 774 shown in graph 779 illustrates the changes to a RWB 772 (in mV) corresponding to a group of cells responsive to respective program step size adjustments 770 (e.g., program step size updates 0 through 20). As an example, the RWB can correspond to a summation of respective read windows such as those described above in FIG. 3 and FIG. 6.

In operation, the program step size adjustments can be made responsive to determining that a measured RWB is different than a target RWB. For instance, in the example shown in FIG. 7, the RWB is between about 2,300 mV and 2,500 mV prior to any program step size update. Subsequent program step size updates can be made to move the RWB toward the target RWB, which may be about 2,050 mV, in this example. If the measured RWB is determined to be below the target RWB, then the next subsequent update can involve adjusting the step size (e.g., decreasing the step size) in order to increase the measured RWB. Conversely, if the measured RWB is determined to be below the target RWB, then the next subsequent update can involve adjusting the step size (e.g., increasing the step size) in order to decrease the measured RWB toward the target RWB. The amount of the step size adjustment associated with the respective updates can be based on a linear relationship such as that described in FIG. 6, for example. Determining an amount of step size adjustment to achieve a particular RWB adjustment is described further below.

Figure 8:
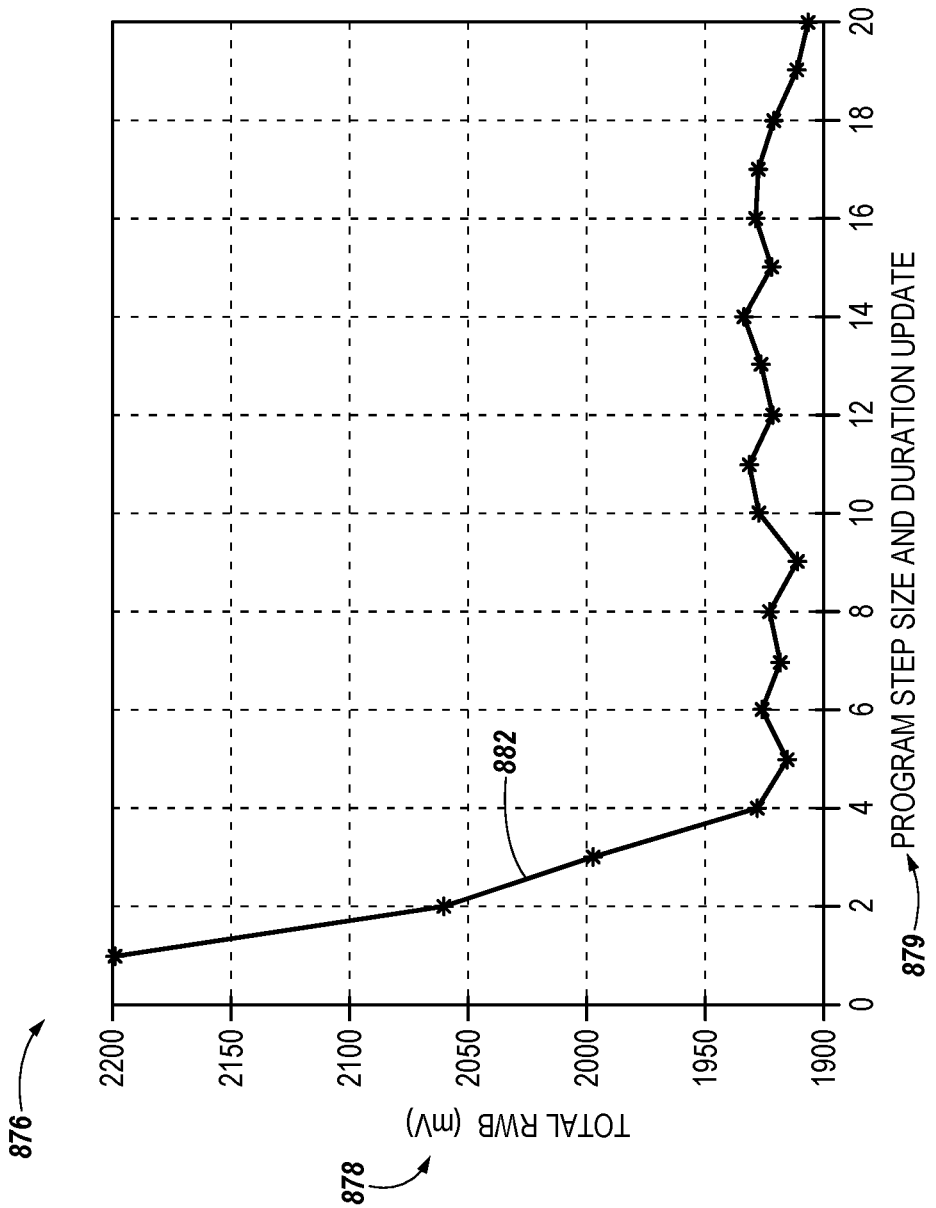
FIG. 8 is a diagram illustrating how adjusting one or more program step characteristics affects the read window budget in accordance with some embodiments of the present disclosure.

FIG. 8 is a diagram 876 illustrating how adjusting one or more program step characteristics affects the read window budget in accordance with some embodiments of the present disclosure. Curve 882 shown in graph 876 illustrates the changes to a RWB 878 (in mV) corresponding to a group of cells responsive to respective combined program step size and program step duration adjustments 879 (e.g., program step size and duration updates 0 through 20). As an example, the RWB can correspond to a summation of respective read windows such as those described above in FIG. 3 and FIG. 6.

In operation, the program step size and/or program step duration adjustments can be made responsive to determining that a measured RWB is different than a target RWB. For instance, in the example shown in FIG. 8, the RWB is greater than 2,200 mV prior to any program step size update. Subsequent program step size and/or step duration updates can be made to move the RWB toward the target RWB, which may be about 1,925 mV, in this example. If the measured RWB is determined to be below the target RWB, then the next subsequent update can involve adjusting the step size, the step duration, or both in order to increase the measured RWB. Conversely, if the measured RWB is determined to be below the target RWB, then the next subsequent update can involve adjusting the step size, the step duration, or both in order to decrease the measured RWB toward the target RWB. The amount of the step size and step duration adjustments associated with the respective updates can be based on a determined change needed to null the difference between the measured RWB and the target RWB. Determining an amount of step size and step duration adjustment to achieve a particular RWB adjustment is described further below. Adjusting both the step time and step duration can provide benefits such as an ability to provide finer RWB adjustments as compared to methods in which only one or the other of program step size and program step duration are adjusted in order to adjust the RWB.

Figure 9:
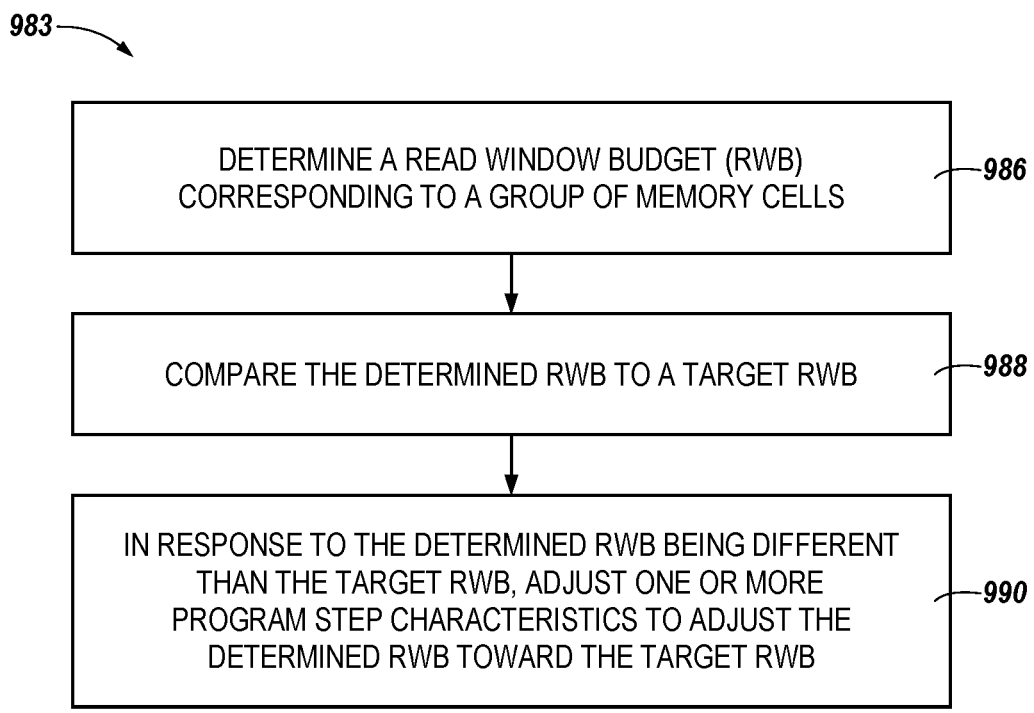
FIG. 9 is a flow diagram of an example method corresponding to adjusting a read window budget in accordance with some embodiments of the present disclosure.
Figure 10:
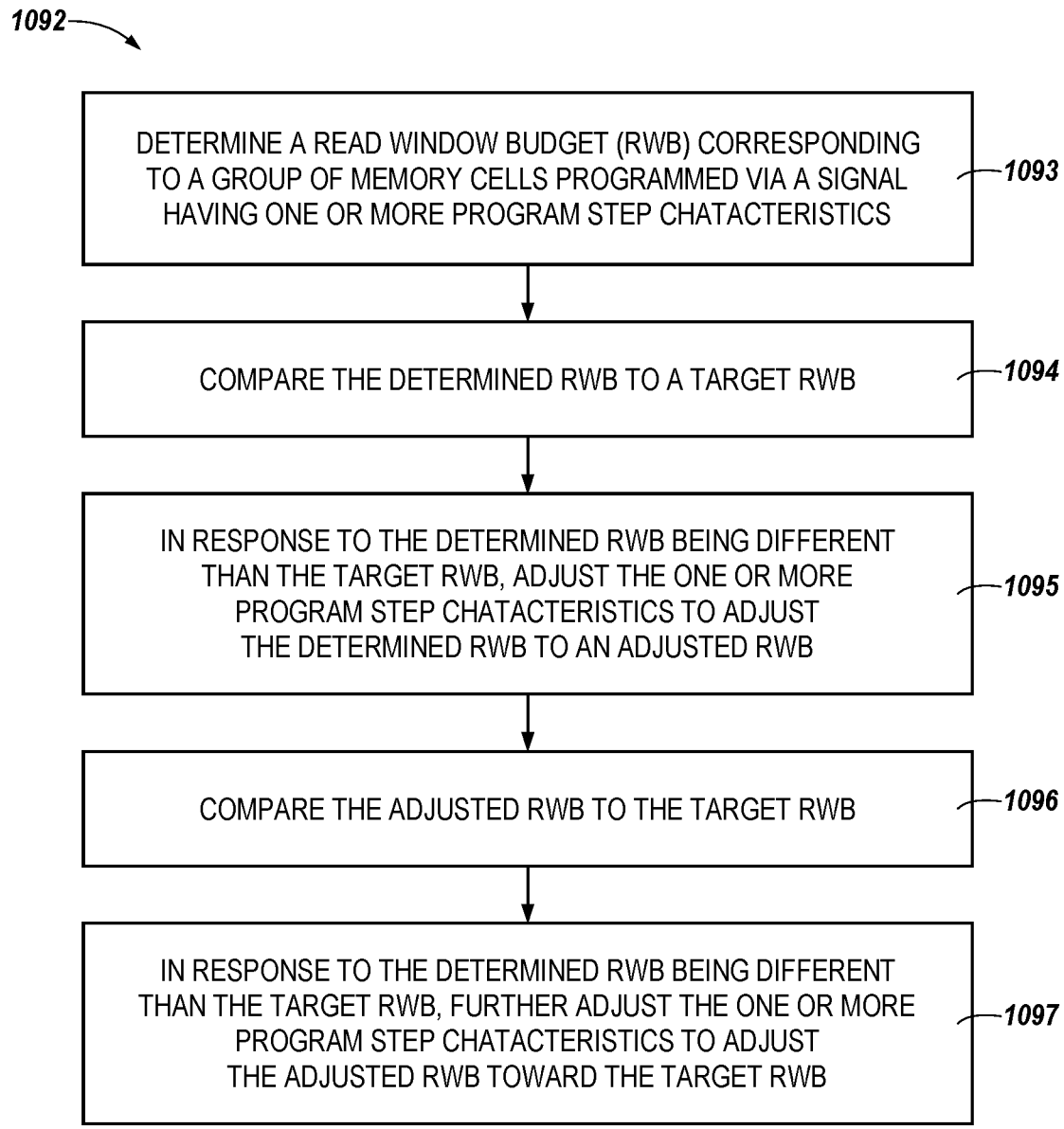
FIG. 10 is a flow diagram of an example method corresponding to adjusting a read window budget in accordance with some embodiments of the present disclosure.

FIGS. 9 and 10 are flow diagrams of example methods corresponding to adjusting a read window budget in accordance with some embodiments of the present disclosure. The methods 983 and 1092 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the methods 983 and 1092 are performed by the RWB adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 986, the processing device (e.g., processing device 112) determines a read window budget (RWB) based on one or more program step characteristics. In some embodiments, program step characteristics can include at least one of a program step size or a program step duration, as described herein.

In some embodiments, determining the RWB as illustrated at block 986 can be performed on a periodic basis, in response to a number of drive fills, a number of program/erase counts, a number of input/output (I/O) operations, input/output workload, and/or a temperature change exceeding a threshold value.

At block 988, the processing device compares the determined RWB to a target RWB. The target RWB can be provided by an input to the memory system. The target RWB can be provided based on an error threshold and/or other parameters or thresholds that can limit a RWB value. At block 990, the processing device, in response to the determined RWB being different than the target RWB, adjusts the one or more program step characteristics that, for example, include at least one of a program step size or a program step duration. For example, the memory system can increase or decrease the program step size and/or program step duration, which will correspondingly increase or decrease the RWB by a particular amount based on determined relationships. Either of these parameters can be adjusted, or both can be adjusted, to achieve a particular RWB aligned with the target RWB.

A relationship exists between a program step size and a RWB. A relationship also exists between a program step duration and the RWB. These relationships can be combined and used to correspond (e.g., in a linear or nonlinear relationship) to the change in RWB with a particular resolution (e.g., a higher resolution). In this example, the change in the RWB ("DeltaRWB") can be equal to a change in program step size ("DeltaProgramStep") plus a change in program step duration ("DeltaProgramTime"), as demonstrated by the formula:

$$DeltaRWB = DeltaProgramStep + DeltaProgramTime$$

where a known delta of a program step duration can be equivalent to one increment of a program step size. As an example, if one increment of a program step size results in a 5% change in RWB and "n" number of increments of delta program step duration also results in a 5% change in RWB, then changing the RWB time by 5% can be accomplished by either changing the program step size by one increment or changing the program step duration by n number of increments. To change the effective program by only 2%, the program step size can remain the same and the program step duration delta could be adjusted by (2%/5%)*n. To change the RWB by 13%, the program step size delta could be 2, resulting in 2*5%=10% plus a change in the program step duration of (3%/5%)*n.

In one example, the two relationships can be treated as linear relationships. In one example, the two relationships that affect RWB can be represented by a formula which can include dependencies and non-linear effects. In another example, the relationships can be represented as tables which are indexed in a linear fashion but output differing amounts based on their index. In this example where the delta program step size and the delta program step duration are used as a function, the combination of the two parameters can be computed for a given change in RWB. As an example:

$$[Program\ Step, ProgramTime] = funcProgramStep\_ProgramTime(RWBdelta)$$

In the example where the delta program step size and the delta program step duration is used as a table lookup, the combination of the two parameters can be pre-computed for a given change in RWB, such as in Table 1 below:

TABLE 1

| TableIndex | ProgramStep | ProgramTime | RWBdelta |
|---|---|---|---|
| 0 | −2 | 0 | −2.00 |
| 2 | −2 | 7 | −1.50 |
| 3 | −1 | 0 | −1.00 |
| 5 | −1 | 10 | −0.50 |
| 6 | 0 | 0 | 0.00 |
| 8 | 0 | 10 | 0.50 |
| 9 | 1 | 0 | 1.00 |
| 11 | 1 | 10 | 1.50 |
| 12 | 2 | 0 | 2.00 |
| 14 | 2 | 12 | 2.50 |

Note that the program step duration for the table index of 2 is 7 and the program step duration for the table index of 14 is 12, illustrating a non-linear relationship.

FIG. 10 is a flow diagram of an example method 1092 for adjusting a read window budget (RWB) in accordance with some embodiments of the present disclosure. At block 1093, the processing device (e.g., processing device 112) determines a read window budget (RWB) based on one or more program step characteristics. In some embodiments, program step characteristics can include at least one of a program step size or a program step duration, as described herein.

At block 1094, the processing device compares the determined RWB to a specific RWB. The specific RWB can be provided by an input to the memory system. The specific RWB can be provided based on an error threshold and/or other parameters or thresholds that can limit a RWB value. At block 1095, the processing device, in response to the determined RWB being different than the target RWB, adjusts the one or more program step characteristics that, for example, includes at least one of the program step size or the program step duration. Either of these parameters can be adjusted, or both can be adjusted, to achieve a particular RWB that can be in line with the specific RWB.

At block 1096, the processing device compares the adjusted RWB to the target RWB. At block 1097, the processing device, in response to the adjusted RWB being different than the target RWB, further adjusts the one or more program step characteristics that, for example, includes at least one of the program step size or the program step duration. As an example, the initial attempt of adjustment of the RWB from the determined RWB to the target RWB can have some errors and this second comparison could identify those errors and adjust again. In the alternative, parameters while operating the memory could create anomalies in the memory cells and an adjustment to realign the RWB to the target RWB can be performed. These anomalies can be created by wearing on the memory cells from many reads and/or writes to and from the cells. These anomalies can be created by temperature fluctuations that can damage and/or alter the memory cells. Whiles these examples are given, examples are not so limited. Any parameters that affect the memory cells and their ability to be programmed could affect the RWB and use additional adjustment. This repetition of adjustment can be performed in a dynamic feedback loop where each subsequently adjusted RWB is compared to a previously adjusted RWB in order to fine tune the working RWB to be the same as the target RWB.

Figure 11:
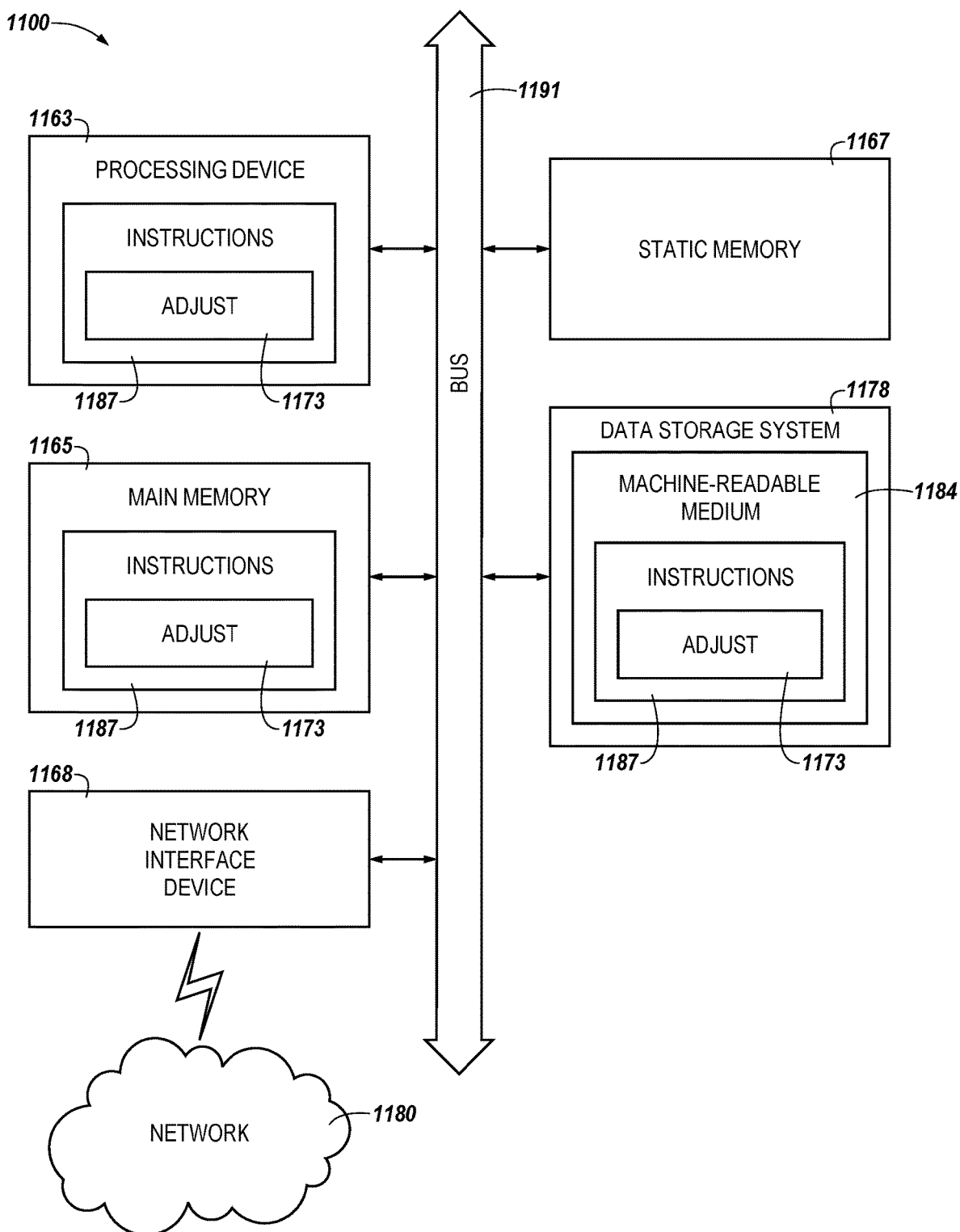
FIG. 11 is a block diagram of an example computer system in which embodiments of the present disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., to adjust a parameter associated with programming a memory cell, such as program step characteristic component 115). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1163, a main memory 1165 (e.g., read-only memory (ROM), flash memory, dynamic random access memory (DRAM) such as synchronous DRAM (SDRAM) or Rambus DRAM (RDRAM), etc.), a static memory 1167 (e.g., flash memory, static random access memory (SRAM), etc.), and a data storage system 1178, which communicate with each other via a bus 1191.

Processing device 1163 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1163 can also be one or more special-purpose processing devices such as an application specific integrated circuit (ASIC), a field programmable gate array (FPGA), a digital signal processor (DSP), network processor, or the like. The processing device 1163 is configured to execute instructions 1187 for performing the adjustment operations using an adjustment component 1173 (including either or both of the program step size component and the program step duration component previously described) and steps discussed herein. The computer system 1100 can further include a network interface device 1168 to communicate over the network 1180.

The data storage system 1178 can include a machine-readable storage medium 1184 (also known as a computer-readable medium) on which is stored one or more sets of instructions 1187 or software embodying any one or more of the methodologies or functions described herein. The instructions 1187 can also reside, completely or at least partially, within the main memory 1165 and/or within the processing device 1163 during execution thereof by the computer system 1100, the main memory 1165 and the processing device 1163 also constituting machine-readable storage media. The machine-readable storage medium 1184, data storage system 1178, and/or main memory 1165 can correspond to the memory sub-system 104 of FIG. 1.

In one embodiment, the instructions 1187 include instructions to implement functionality corresponding to a program step characteristic component (e.g., program step characteristic component 115 of FIG. 1). While the machine-readable storage medium 1184 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
    a memory component including a group of memory cells; and
    a processing device coupled to the memory component and configured to:
        compare a read window budget (RWB) corresponding to the group of memory cells to a target RWB; and
        in response to the RWB being different than the target RWB, adjust a program step size associated with the group of memory cells to adjust the RWB corresponding to the group of memory cells toward the target RWB, wherein the program step size corresponds to a voltage difference between consecutive programming signals of a series of programming signals applied to the group of memory cells to program the group of memory cells to a particular data state.

2. The system of claim 1, wherein:
    the program step size is one of a number of program step characteristics further comprising a program step duration; and
    the processing device is configured to adjust one or more of the program step characteristics to adjust the determined RWB toward the target RWB.

3. The system of claim 2, wherein the processing device is further configured to adjust the program step size without adjusting the program step duration of the programming signal to adjust the RWB corresponding to the group of memory cells to the target RWB.

4. The system of claim 2, wherein the processing device is further configured to adjust the program step duration without adjusting the program step size of the programming signal to adjust the RWB corresponding to the group of memory cells to the target RWB.

5. The system of claim 1, wherein the processing device is further configured to increase the program step size in response to the RWB corresponding to the group of memory cells being below the target RWB.

6. The system of claim 1, wherein the processing device is further configured to decrease the program step size in response to the RWB corresponding to the group of memory cells being above the target RWB.

7. The system of claim 1, wherein a relationship between the program step size and the RWB corresponding to the group of memory cells is a linear relationship such that the RWB corresponding to the group of memory cells is adjusted proportional to the adjusted program step size.

8. The system of claim 1, wherein a relationship between the program step size and the RWB corresponding to the group of memory cells is a non-linear relationship such that the RWB corresponding to the group of memory cells is adjusted non-proportional to the adjusted program step size.

9. A system, comprising:
    a memory component including a group of memory cells; and
    a processing device coupled to the memory component and configured to:
        compare a read window budget (RWB) corresponding to the group of memory cells to a target RWB; and
        in response to the RWB being different than the target RWB, adjust a program step duration associated with the group of memory cells to adjust the RWB corresponding to the group of memory cells toward the target RWB, wherein the program step duration corresponds to a duration for which the programming signal is applied to the group of memory cells.

10. The system of claim 9, wherein:
    the program step duration is one of a number of program step characteristics further comprising a program step size; and
    the processing device is configured to adjust both the program step time and the program step duration to adjust the RWB corresponding to the group of memory cells toward the target RWB.

11. The system of claim 9, wherein:
the program step duration is one of a number of program step characteristics further comprising a program step size; and
the processing device is configured to adjust one or more of the program step characteristics to adjust the determined RWB toward the target RWB.

12. The system of claim 11, wherein the processing device is configured to:
adjust one or more of the program step characteristics to decrease the RWB corresponding to the group of memory cells in response to the RWB corresponding to the group of memory cells being above the target RWB; and
adjust one or more of the program step characteristics to increase the RWB corresponding to the group of memory cells in response to the RWB corresponding to the group of memory cells being below the target RWB.

13. The system of claim 9, wherein the target RWB is provided to the processing device as an input.

14. The system of claim 9, wherein the target RWB is determined based on an error threshold.

15. A method, comprising:
comparing a read window budget (RWB) corresponding to a group of memory cells to a target RWB; and
in response to the RWB being different than the target RWB, adjusting one or more programming characteristics associated with the group of memory cells, wherein the one or more programming characteristics comprises a program step size and a program step duration; and wherein:
the program step size corresponds to a voltage difference between consecutive programming signals of a series of programming signals applied to the group of memory cells to program the group of memory cells to a particular data state; and
the program step duration corresponds to a duration for which the programming signal is applied to the group of memory cells.

16. The method of claim 15, further comprising:
comparing the adjusted RWB to the target RWB; and
in response to the RWB being different than the target RWB, repeating the adjustment of the one or more programming characteristics associated with the group of memory cells until the adjusted RWB becomes the target RWB.

17. The method of claim 15, further comprising decreasing the program step size and the program step duration each by a respective particular amount in response to determining that the RWB corresponding to the group of memory cells is less than the target RWB.

18. The method of claim 15, further comprising adjusting the one or more programming characteristics associated with the group of memory cells based, at least partially, on a number of drive fills.

19. The method of claim 15, further comprising adjusting the one or more programming characteristics associated with the group of memory cells based, at least partially, on a number of program/erase counts.

20. The method of claim 15, further comprising adjusting the one or more programming characteristics associated with the group of memory cells based, at least partially, on a number of input/output (I/O) workload.

* * * * *